US006295308B1

(12) United States Patent
Zah

(10) Patent No.: US 6,295,308 B1
(45) Date of Patent: Sep. 25, 2001

(54) WAVELENGTH-LOCKED EXTERNAL CAVITY LASERS WITH AN INTEGRATED MODULATOR

(75) Inventor: Chung-en Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/386,621

(22) Filed: Aug. 31, 1999

(51) Int. Cl.$^7$ .................................................. H01S 5/00
(52) U.S. Cl. ................................................ 372/50; 372/97
(58) Field of Search .................................................. 372/50

(56) References Cited

U.S. PATENT DOCUMENTS

| | | |
|---|---|---|
| 4,745,606 | 5/1988 | Uehara et al. . |
| 4,904,045 | 2/1990 | Alferness et al. . |
| 4,955,006 * | 9/1990 | Fukushima ............................. 369/13 |
| 5,166,940 | 11/1992 | Tumminelli et al. . |
| 5,255,274 | 10/1993 | Wysocki et al. . |
| 5,290,730 * | 3/1994 | McFarlane ............................ 437/129 |
| 5,305,343 | 4/1994 | Allovon et al. . |
| 5,321,718 | 6/1994 | Waarts et al. ......................... 372/108 |
| 5,432,123 | 7/1995 | Dentai et al. . |
| 5,434,874 | 7/1995 | Fouquet et al. . |
| 5,479,291 * | 12/1995 | Smith .................................... 359/333 |
| 5,548,607 | 8/1996 | Tsang . |
| 5,602,864 | 2/1997 | Welch et al. ............................ 372/50 |
| 5,608,561 | 3/1997 | Marcuse et al. . |
| 5,650,856 * | 7/1997 | Morse ................................... 356/436 |
| 5,663,824 * | 9/1997 | Koch .................................... 359/184 |
| 5,680,411 | 10/1997 | Ramdane et al. . |
| 5,799,024 * | 8/1998 | Bowers ................................. 372/11 |
| 5,828,680 | 10/1998 | Kim et al. . |
| 5,828,681 | 10/1998 | Epworth . |
| 5,844,926 | 12/1998 | Bryon et al. . |
| 5,844,932 | 12/1998 | Thony et al. . |
| 5,870,417 * | 2/1999 | Verdiell ................................. 372/32 |
| 5,883,914 | 3/1999 | Kinoshita . |
| 5,914,977 | 6/1999 | Mukaihara et al. .................... 372/50 |
| 5,943,464 * | 8/1999 | Khodja ................................. 385/122 |
| 6,041,071 * | 3/2000 | Tayebati ................................ 372/64 |
| 6,175,433 * | 1/2001 | Patel .................................... 359/138 |

FOREIGN PATENT DOCUMENTS

| | | |
|---|---|---|
| 19624514 | 6/1996 | (DE) . |
| 0 553 994 A1 | 1/1993 | (EP) . |
| 0 667 660 A1 | 2/1995 | (EP) . |
| 08097491 | 4/1996 | (JP) . |
| 8097491 | 8/1996 | (JP) . |

OTHER PUBLICATIONS

M.R. Amersfoort et al. "Performance Study of a 10–wavelength DFB Laser Array with Integrated Electroabsorption Modulators" LEOS'96—IEEE Lasers and Electro–Optics Society Annual Meeting Th12 (11/96) pp. 335–336.
B. Villeneuve et al. "A Compact Wavelength Stabilization Scheme for Telecommunication Trasmitters" 1977 Digest of the IEEE/LEOS Sumer Topical Meetings (8/97) pp. 19–20.

* cited by examiner

*Primary Examiner*—Teresa M. Arroyo
*Assistant Examiner*—Gioacchino Inzirillo
(74) *Attorney, Agent, or Firm*—Juliana Agon

(57) ABSTRACT

An optical transmitter providing the benefits of both filter-locked and wavelength-locked lasers is disclosed by modifying an external cavity (32) for the integration of an optical modulator (14). The external cavity (32) provides a round-trip path for light travel. A substrate (24) is connected to the external cavity (32) where at least one gain element (16) and the optical modulator (14) are integral with the substrate (24). A partial reflector (40) is also integral with the substrate (24) and couples the at least one gain element (16) with the optical modulator (14).

20 Claims, 10 Drawing Sheets

FIG. 16

| Features | FIG. 11's λ-locked DFB laser | FIGS. 13-14's Filter-locked laser | Filter-locked external cavity laser with an integrated modulator | |
|---|---|---|---|---|
| | | | Internal wide broadband reflector of FIGS 2-3 | Internal DBR reflector of FIG. 4 |
| TE cooler | − yes | + no | + no | − yes |
| Active feedback | − yes | + no | + no | + no |
| High speed modulation | + yes (with integrated modulator) | − no | + yes | + yes |
| Optical misalignment | + power ↓ | power ↓, threshold ↓, speed ↓ | +/− power ↓, threshold ↓ | +/− power ↓, threshold ↓ |

(+) advantage and (−) disadvantage. (↑) increase and (↓) decrease.

WAVELENGTH-LOCKED EXTERNAL CAVITY LASERS WITH AN INTEGRATED MODULATOR

BACKGROUND OF THE INVENTION

1. Field of the Invention

The present invention relates generally to lasers, and particularly to external cavity lasers for use as a transmitter in optical communications.

2. Technical Background

In dense wavelength division multiplexing (DWDM) system applications, the transmitter wavelength has to be locked to one of the International Telephone Union (ITU) standard wavelengths of an ITU grid to meet crosstalk specification and ensure reliable operation of the system over its lifetime (about 25 years). The lasing wavelength of a free running commercial distributed feedback (DFB) laser, determined by its built-in DFB grating and refractive index of the semiconductor waveguide, changes with temperature at a rate of 0.1 nm/° C. FIG. 11 shows a wavelength-locked DFB laser demonstrated by Nortel Technology as described in the article by B. Villeneuve, H. B. Kim, M. Cyr and D. Gariepy, "A compact wavelength stabilization scheme for telecommunication transmitter," *Digest of the LEOS Summer Topical Meetings, WDM Components Technology,* WD2, 19–20, Aug. 13–15, 1997, Montreal, Quebec, Canada. A slightly diverging beam of laser light 112 transmitted through a Fabry Perot filter or a single-cavity multilayer dielectric filter 114 is detected by two closely spaced photodetectors 116 acting as apertures. The photodetectors 116 are equally spaced from the centerline of a semiconductor source laser 118. Each photodetector 116 captures a different but overlapping center portion of the total solid angle emitted by the divergent laser light source, as the filter 114 is aligned to control and monitor the transmission wavelengths. Two different spectral responses, offset in wavelengths according to their angular difference, are produced as shown in FIG. 12. The difference or discrimination signal 222 is used by an operational amplifier 220 to control a heat sink temperature to lock the lasing wavelength to the ITU wavelength or center frequency $\lambda_0$.

FIG. 12 shows the ideal case where the wavelength offset between the two responses is roughly equal to their effective bandwidths such that the center frequency is centered at the ITU wavelength. However, to reduce cost, it is desirable to eliminate the extra external feedback parts of the operational amplifier 220 and photodiodes 116 needed for wavelength discrimination in this type of temperature control of a wavelenth-locked laser while maintaining or improving temperature reliability.

Filter-locked external cavity lasers as shown in FIGS. 13 and 14 have recently been proposed and demonstrated. These lasers do not need the feedback control to monitor wavelengths since the center wavelength of its filters, made of a dielectric material, such as the fiber grating and the multilayer dielectric filter, has been demonstrated to be much less sensitive to temperature (<0.005 nm/° C.) than that of the semiconductor grating filter used in the DFB laser. A reflective Bragg grating written into the fiber establishes the precise lasing wavelength. One of the frequencies of the ITU grid is selected for the Bragg grating. The advantage of writing the frequency into the silica fiber is that the silica has a small coefficient of thermal expansion (about $5 \times 10^{-7}$/° C.) and the resonant Bragg frequency changes can be made negligible by temperature compensation.

As seen in FIG. 13 and described in U.S. Pat. No. 5,844,926, a semiconductor laser diode chip 118 is provided with an anti-reflection (AR) coating 26 on one end facet 132 to which is optically coupled a length of optical fiber pigtail 134 in which there is a Bragg grating reflector 136 defining one end of a laser optical cavity whose other end is provided by the reflecting end facet 138 of the laser chip remote from the AR coated end facet. This Bragg grating reflector thus provide a means of locking the laser frequency.

Instead of using fiber, air can be substituted in the external cavity of FIG. 14. Here and described in U.S. Pat. No. 5,434,874 and U.S. Pat. No. 5,870,417, a gain medium, such as the semiconductor (laser chip) 118 has both front 138 and back 132 facets, as in FIG. 13, where the back facet 132 has the anti-reflection coating 26. Light 142 from the laser chip passes through the back facet 132 into an external air cavity. The cavity contains a tuning element 162, such as a prism, mirror, filter, or grating, that reflects specific laser wavelengths back into the laser chip 118. This round-trip light action 142 causes the laser to output selectable wavelengths 62 through the front facet 138. Thus, the wavelength of light output 62 from the front 138 facet of the laser chip can be controlled by changing the angle of the grating, filter or other tuning element 162. The cavity also contains a collimating lens 144 which directs light emitted from the rear facet 132 of the chip onto the grating, filter, or other tuning element 162.

However, due to its long external cavity, the filter-locked laser can not be directly modulated at a high bit rate. The 3-dB modulation bandwidth decreases as the external passive cavity length increases as seen in FIG. 9. For example, the direct modulation bandwidth of a semiconductor laser with a 300 μm cavity length is about 10 GHz. Therefore, it is difficult to directly modulate a filter-locked laser at a rate of 2.5 Gbit/sec and beyond since the external passive cavity length is in the order of 1 cm or longer. Moreover, the direct modulation response at the frequency (peak frequency) corresponding to the round trip time is significantly enhanced as shown in FIG. 15. The peak frequency as a function of the external passive cavity length is shown in FIG. 10. If the peak frequency is close to one of the harmonic frequencies of the signal, the signal will be distorted. An external modulator is thus needed for high speed modulation. Additionally, there is at least a cost saving reason to integrate an external cavity laser with an external modulator.

SUMMARY OF THE INVENTION

One aspect of the present invention is an optical transmitter which provides the benefits of both filter-locked and wavelenth-locked lasers is taught by modifying an external cavity for the integration of an external modulator. The external cavity provides a round-trip path for light travel. A substrate is connected to the external cavity where at least one gain element and an optical modulator are integral with the substrate. A partial reflector is also integral with the substrate and couples the at least one gain element with the optical modulator.

In another aspect, the present invention includes a saturable absorber integrated between the gain element and the partial reflector. In a further aspect of the invention, the substrate is a waveguide having a first anti-reflection (AR) coated facet and a second opposed AR coated facet on opposed ends of the waveguide.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 16 is a chart showing a comparison among prior-art wavelength-locked, prior-art filter-locked, and the wavelength locked laser with an integrated modulator of the present invention.

DETAILED DESCRIPTION OF THE PREFERRED EMBODIMENTS

Figure 1:
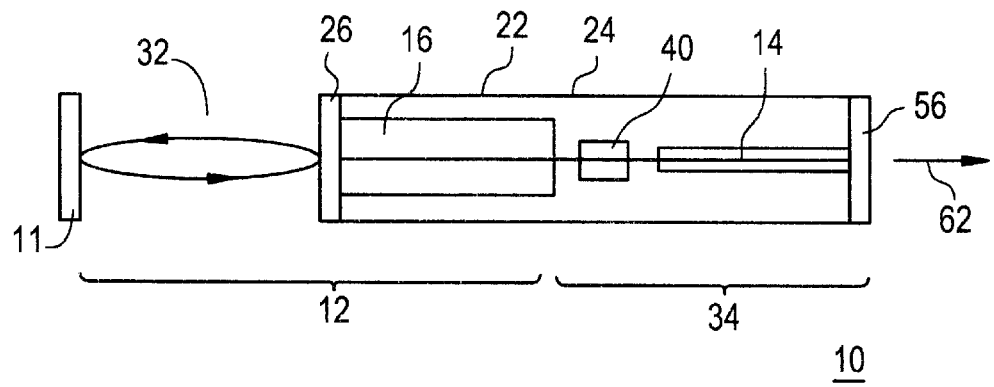
FIG. 1 is a diagrammatic depiction of a wavelength-locked external cavity laser with an integrated modulator, in accordance with the present invention.

Reference will now be made in detail to the present preferred embodiments of the invention, examples of which are illustrated in the accompanying drawings. Wherever possible, the same reference numbers will be used throughout the drawings to refer to the same or like parts. An exemplary embodiment of an optical transmitter of the present invention is shown in FIG. 1, and is designated generally throughout by reference numeral 10.

In accordance with the invention, the present invention of a transmitter includes an optical modulator 14 integrated with a filter-locked external cavity laser 12. An integrated approach is used to build a wavelength-locked external cavity laser 10 by modifying a basic filter-locked external cavity laser that is conventionally implemented as in FIGS. 13 and 14 for the addition of the inventive integrated modulator.

FIG. 16 shows the advantages of achievable high speed modulation without the additional components of active feedback realizable with the integration of the modulator in the filter-locked external cavity laser. In accordance with the teachings of the present invention, a wavelength-locked external laser is such provided with an integrated modulator for high speed DWDM system applications. Its inventive features and advantages are compared with other conventional approaches and summarized in FIG. 16. The transmitter formed by such a wavelength-locked external laser with an integrated modulator is very attractive to DWDM system integrators since such a transmitter eliminates the expensive items of active feedback control to lock its wavelength to the ITU wavelength and the discrete external modulator for high speed modulation.

Figure 13:
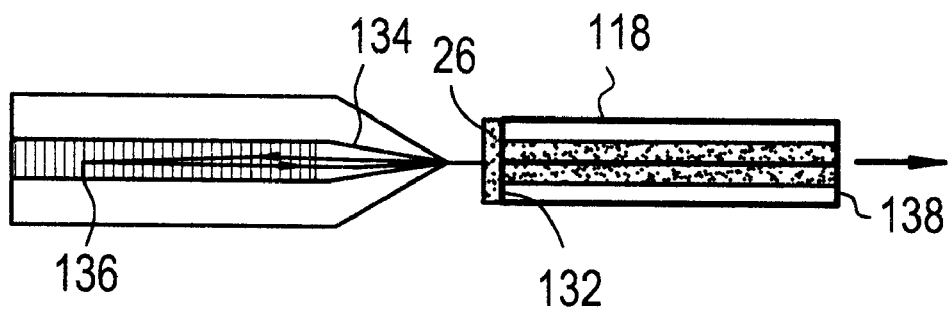
FIG. 13 is a diagrammatic depiction of a prior-art filter-locked external cavity laser having fiber as its external cavity.
Figure 14:
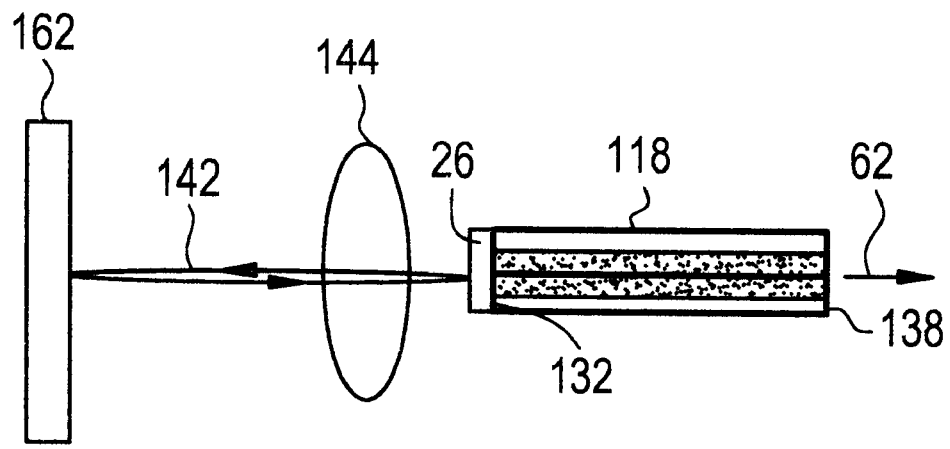
FIG. 14 is a diagrammatic depiction of a prior-art filter-locked external cavity laser having air as its external cavity.
Figure 15:
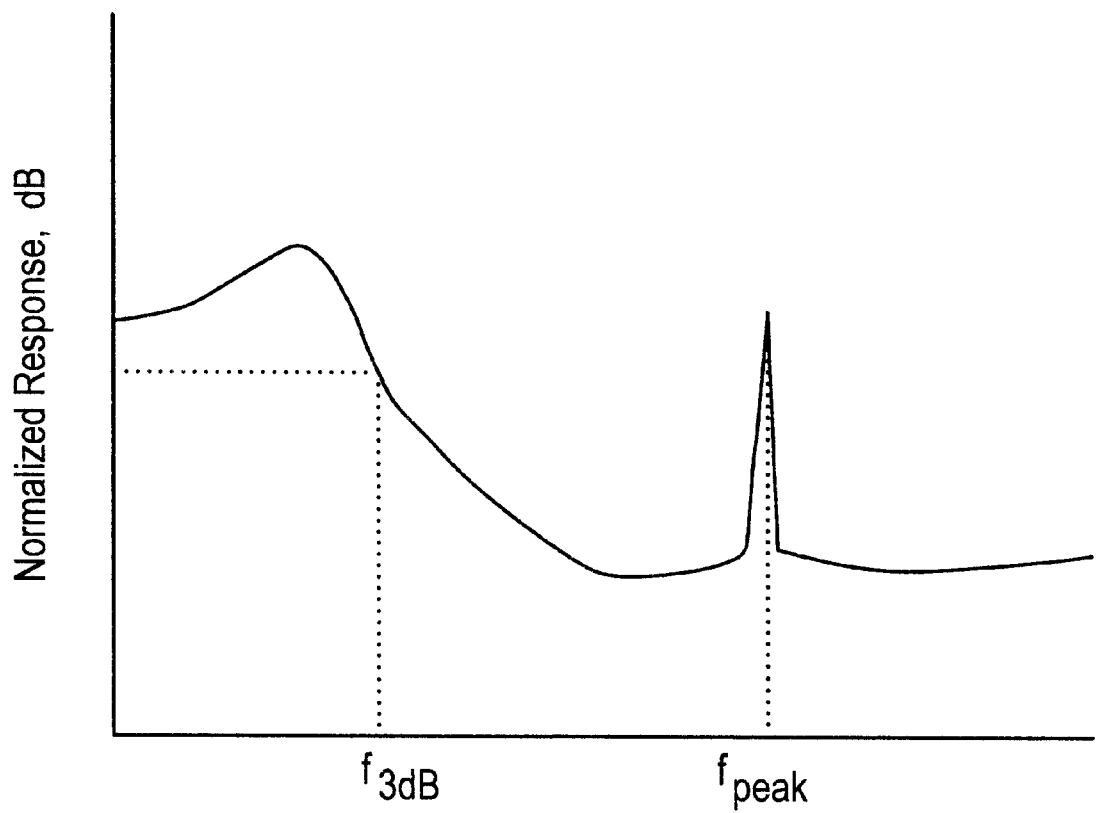
FIG. 15 is a graph of the small signal modulation response of the external cavity lasers of FIGS. 13 and 14.

As embodied herein, and depicted in FIG. 1, referencing similar parts from FIGS. 13 and 14, the external cavity laser 12 includes at least one gain element 16 on a first portion of a semiconductor waveguide substrate or chip 24 having a first anti-reflective (AR) coated facet 26 coupled to an external cavity 32 to provide laser spectral properties, or lasing effects, without additional active feedback. By extending the waveguide substrate 24 to form a second substrate portion 34, the advantages of the present invention can be realized. As embodied herein, and depicted in FIG. 1, the modulator 14 includes a modulator element, such as an electroabsorption or Mach-Zehnder modulator, grown on the second portion or passive region 34 of the substrate 24, between a partial reflector 40 and a second anti-reflection (AR) coated facet 56 of the laser output end of the waveguide substrate 24 to provide high speed modulation. The rest of the second portion 34 of the substrate 24 includes the partial reflector 40 that is preferably broadband and the inventive second AR coated facet 56.

The partial reflector 40 is needed to form one end of a modified extended laser cavity, in accordance with the present invention. The other end of the modified extended cavity is provided conventionally by an external reflector or external mirror 11, preferably in the form of an external wavelength selective filter or other tuning element 162 of FIG. 2, if in an air cavity or by the Bragg grating reflector 136 of FIG. 13, if in a fiber cavity. The partial reflector 40 serves to transmit part of the light as an output to the modulator 14. Additionally, the partial reflector 40 is preferably broadband with respect to the bandwidth of the external reflector or mirror 1, such as the external wavelength selective reflector 162 or grating such that the lasing wavelength is solely determined by the Bragg wavelength of the wavelength selective filter 162 or the Bragg grating.

In order to modulate light 62 externally on a single chip or substrate 24, the broadband partial reflector 40 is created, inserted or otherwise interposed between the gain 16 and modulator 14 sections or portions of the waveguide substrate chip 24. The gain element 16 on the first substrate section or portion-22, as part of the external cavity laser 12, has an active layer with a bandgap wavelength of 1570 nm. If the electroabsorption modulator is utilized, the modulator 14 on the second section 34 has a layer, in the waveguide region, with a bandgap wavelength of 1490 nm. The light is modulated by the electroabsorption effect through the electroabsorption modulator 14. Under zero bias, the light goes through the modulator 14 with little attenuation. Under reverse bias, the light is absorbed since the bandgap of the modulator 14 is red shifted. The laser 16 output is taken from the modulator side or end of the waveguide 24. Antireflection (AR) coatings are preferably applied on both end facets 26 and 56 to avoid spectral degradation due to potential compound cavity effects. The fabrication process to form these two substrate sections or portions 22 and 34 has been used to create the modulator-integrated DFB lasers as described in the article "Performance study of a 10-wavelength DFB laser array with integrated electroabsorption modulators," *Proc. of IEEE Lasers and Electro-Optics Society Annual Meeting*, ThI2, Boston, Mass., Nov. 18–21, 1996.

Figure 2:
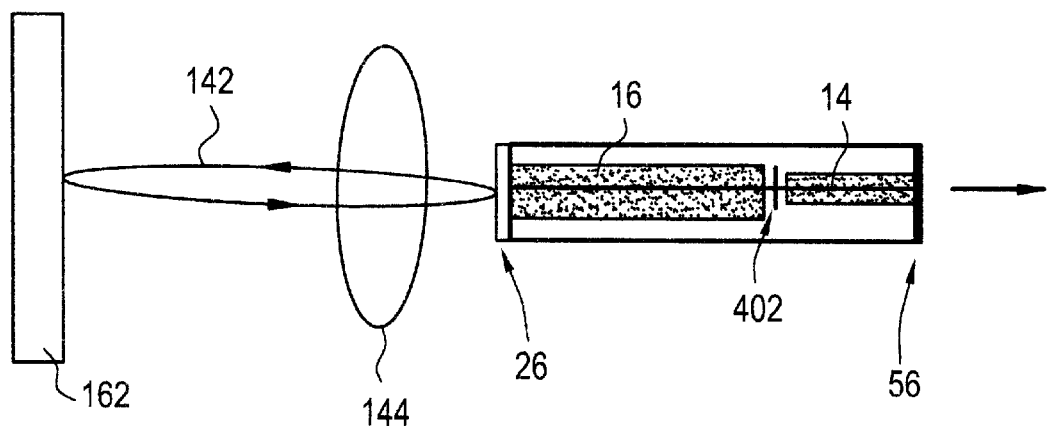
FIG. 2 is a diagrammatic depiction of a wavelength-locked external cavity laser with an integrated modulator, having the partial reflector 40 of FIG. 1, embodied as an etched facet in accordance with the present invention.
Figure 3:
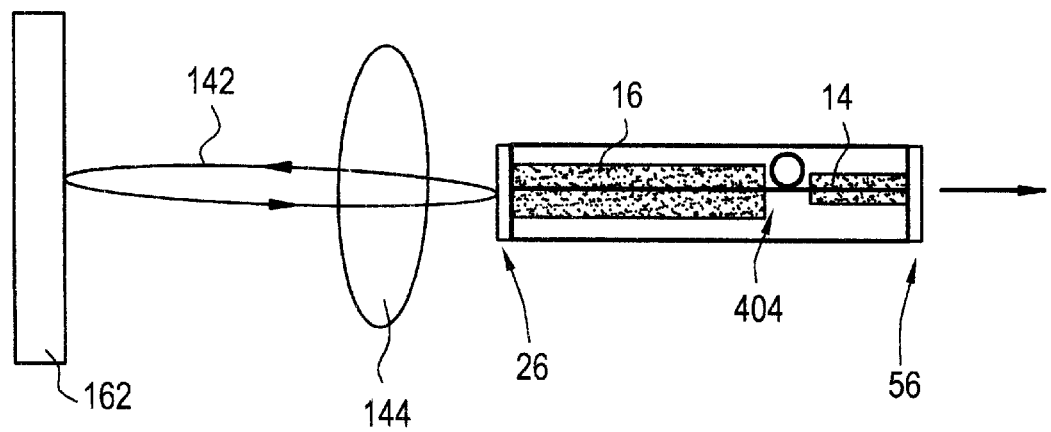
FIG. 3 is a diagrammatic depiction of a wavelength-locked external cavity laser with an integrated modulator, having the partial reflector 40 of FIG. 1, embodied as a waveguide loop mirror in accordance with the present invention.

FIGS. 2 and 3 show at least two approaches out of various embodiments for the partial broadband reflector 40. The broadband internal partial reflector can be formed by either an etched facet (FIG. 2) or a waveguide loop mirror (FIG. 3). Although the etched facet of FIG. 2 is very compact, its fabrication is intricate. A good dry etch process is used to form a suitable mirror and accurate dimension control is applied to achieve low insertion loss and provide an accurate splitting ratio.

Figure 7:
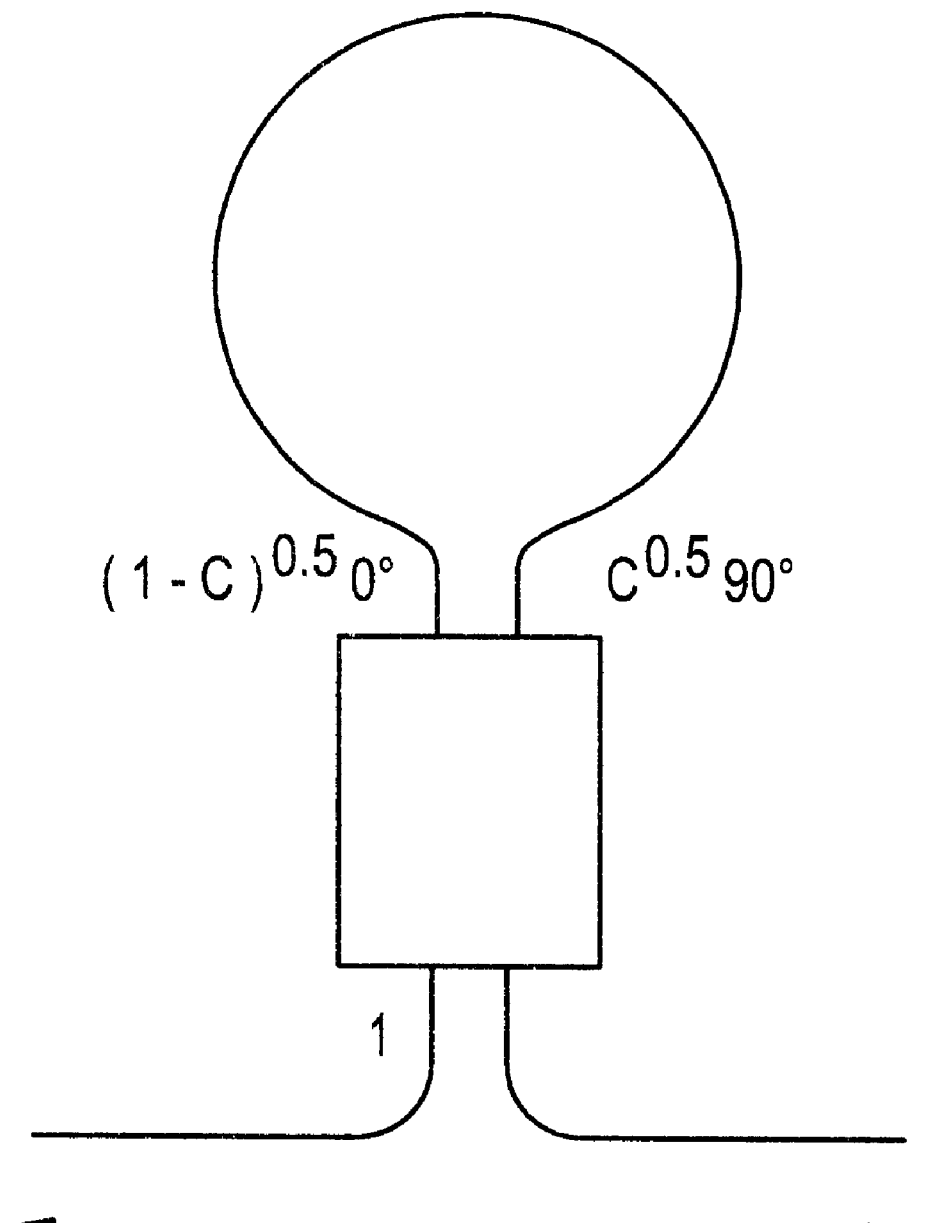
FIG. 7 is a schematic drawing of the waveguide loop mirror 404 of FIG. 3.
Figure 8:
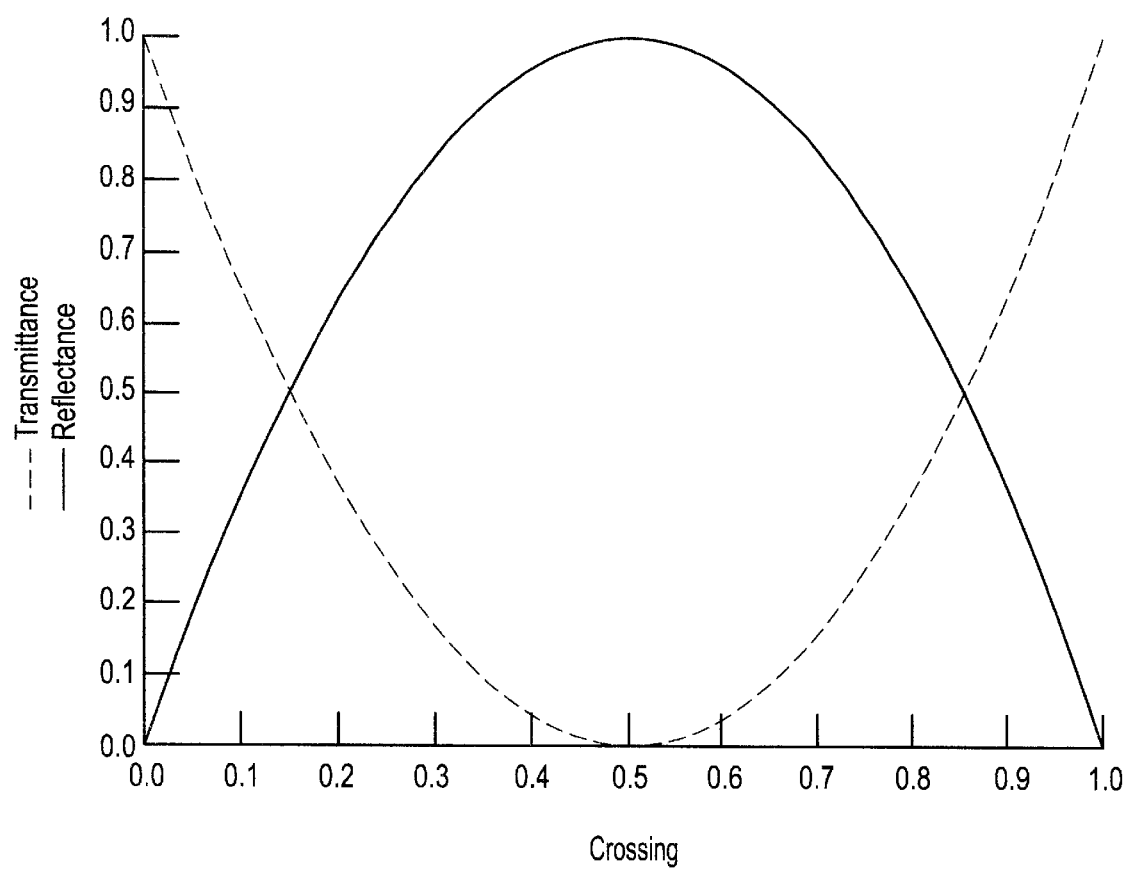
FIG. 8 is a graph of the reflectance and transmittance as a function of the crossing ratio of the 2×2 coupler of the waveguide loop mirror 404 of FIG. 3.
Figure 9:
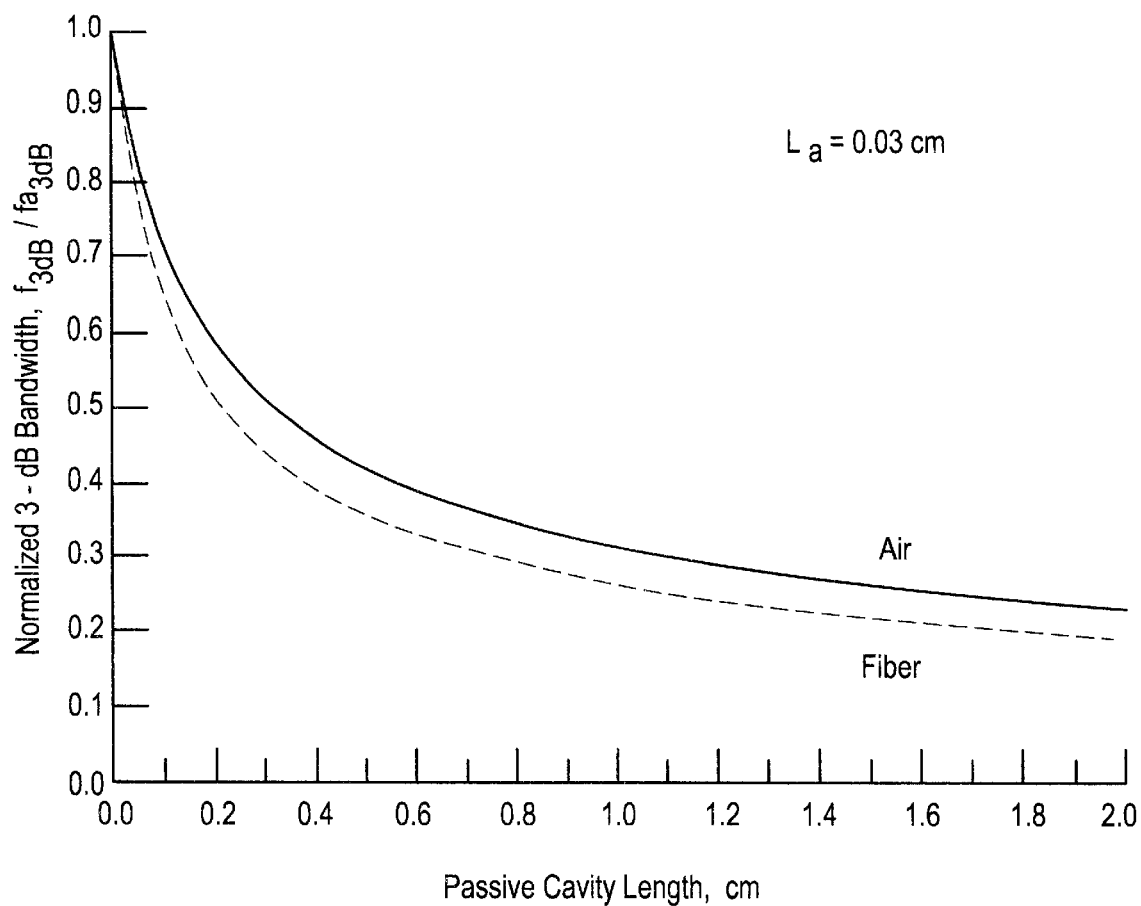
FIG. 9 is a graph of the 3-dB modulation bandwidth as a function of the external passive cavity length of the external cavity lasers of FIGS. 13 and 14.
Figure 10:
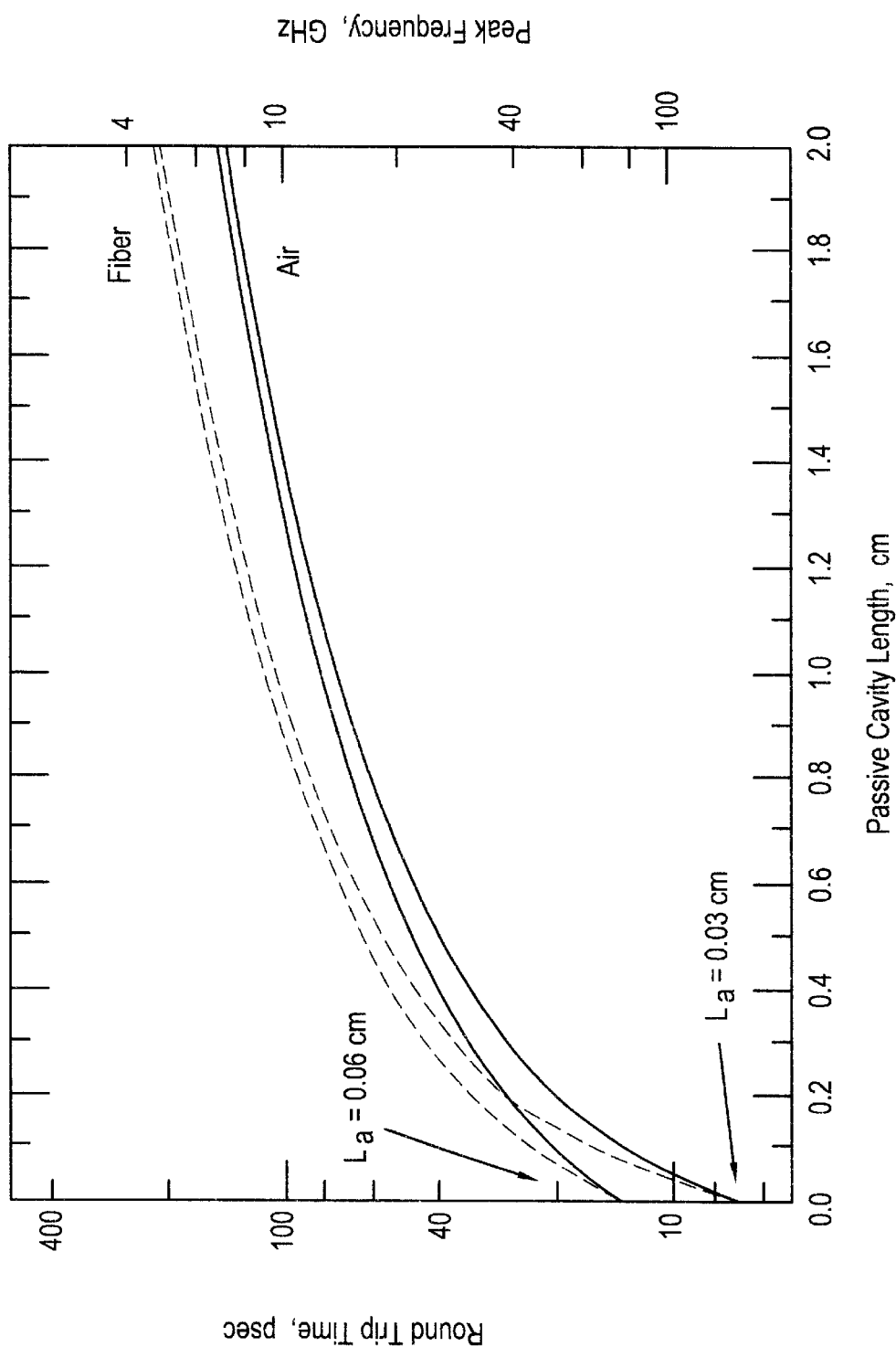
FIG. 10 is a graph of the peak frequency as a function of the external passive cavity length of the of the external cavity lasers of FIGS. 13 and 14.
Figure 11:
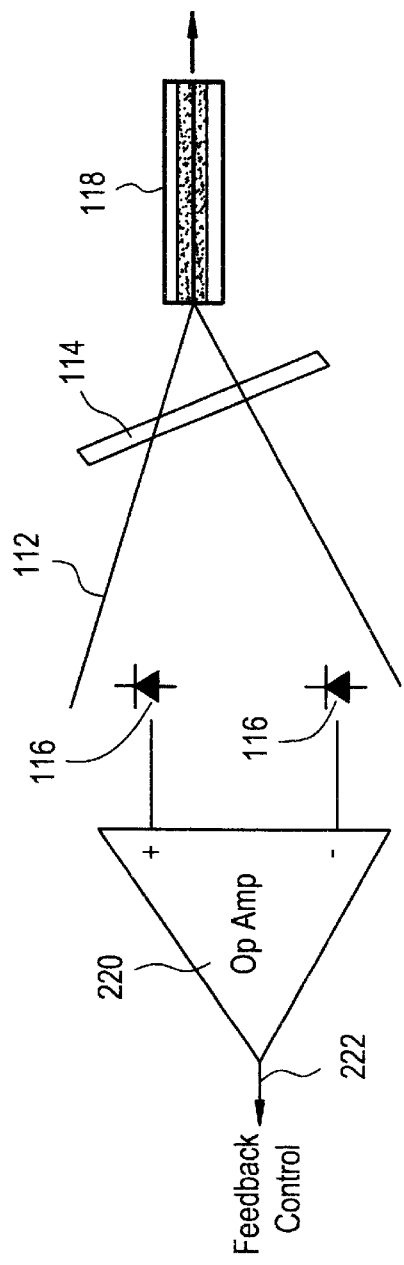
FIG. 11 is a schematic drawing of a prior-art wavelength-locked DFB laser.
Figure 12:
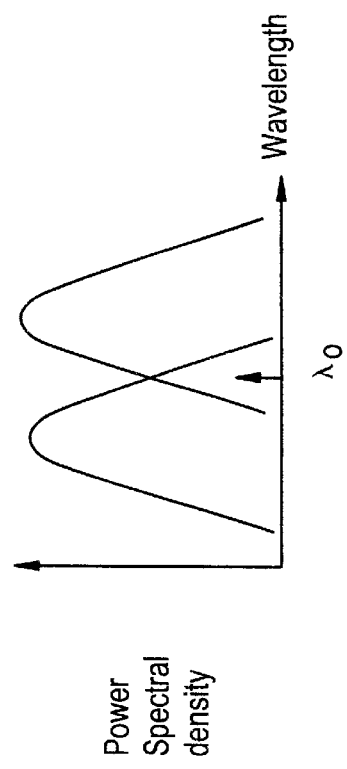
FIG. 12 is the spectral responses from the two photodetectors 116 of FIG. 11 separated in space.

In an alternate embodiment of the invention, as embodied herein and as shown in FIG. 3, the internal reflector 40 of FIG. 1 is a waveguide loop mirror 404. The reflectance and transmittance of a waveguide loop mirror are controlled by the splitting ratio of the 2×2 coupler as shown in FIGS. 7 and 8. Although the loop mirror of FIG. 3 is bigger than the etched facet of FIG. 2, the loop mirror tends to be easier to fabricate. In the above two approaches, thermal electric (TE) cooling (for example, using a heat sink) and temperature control are not needed since the lasing wavelength is determined by the narrow-band external reflector, filter, mirror 11 of FIG. 1 or another type of tuning element 162 of FIG. 14 and FIG. 3 with very low temperature sensitivity.

Figure 4:
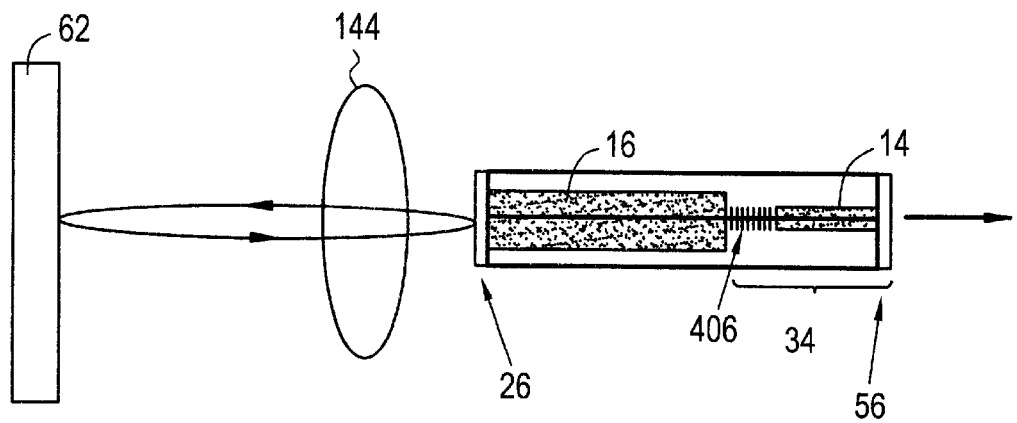
FIG. 4 is a diagrammatic depiction of a wavelength-locked external cavity laser with an integrated modulator, having the partial reflector 40 of FIG. 1, embodied as a distributed Bragg reflector in accordance with the present invention.

In another alternative embodiment of the invention, as embodied herein and as shown in FIG. 4, the internal partial reflector is a distributed Bragg reflector (DBR) 406.

EXAMPLE

The invention will be further clarified by the following example which is intended to be exemplary of the invention.

Example 1

The narrow-band internal partial reflector 40 of FIG. 1 is provided by the distributed Bragg reflector (DBR) 406 in the passive waveguide region 34 in FIG. 4. The reflection band width ($\Delta\lambda_B$) can be written as $$\Delta\lambda_B \sim \frac{\kappa\lambda^2}{\pi n}$$

where $\kappa$ is the grating coupling coefficient, $\lambda$ is the wavelength and n is the refractive index. The reflection bandwidth is about 2 nm assuming that $\lambda=1.55$ $\mu$m and $\kappa=100$/cm. The lasing wavelength is determined by the external filter 62 with a bandwidth much narrower than that of the internal DBR reflector 406. In this approach, the chip fabrication process is exactly the same as for the modulator-integrated DFB laser except that the grating is located on the part of the waveguide 34 layer instead of located on the top of the active layer 22. Since the internal reflection band is narrow, the temperature of the chip needs to be controlled to ±10° C. to ensure that the internal reflection band overlaps the center wavelength of the external filter 162. However, wavelength monitoring to provide active feedback control is not needed.

Figure 5:
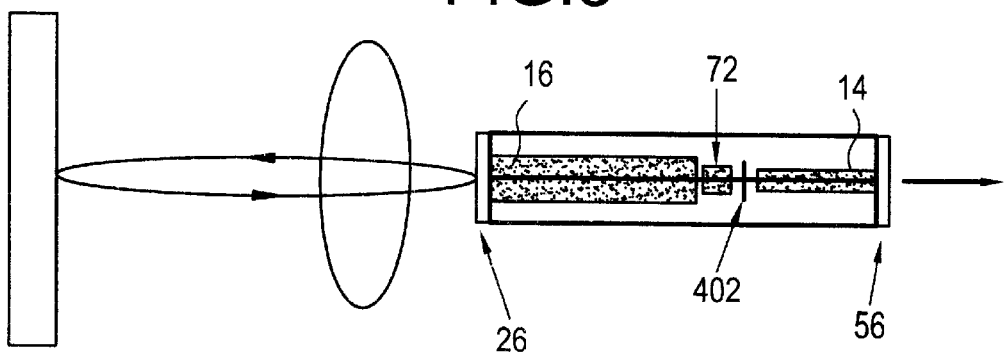
FIG. 5 is a diagrammatic depiction of a mode-locked external cavity laser with an integrated modulator and an etched facet, in accordance with the present invention.
Figure 6:
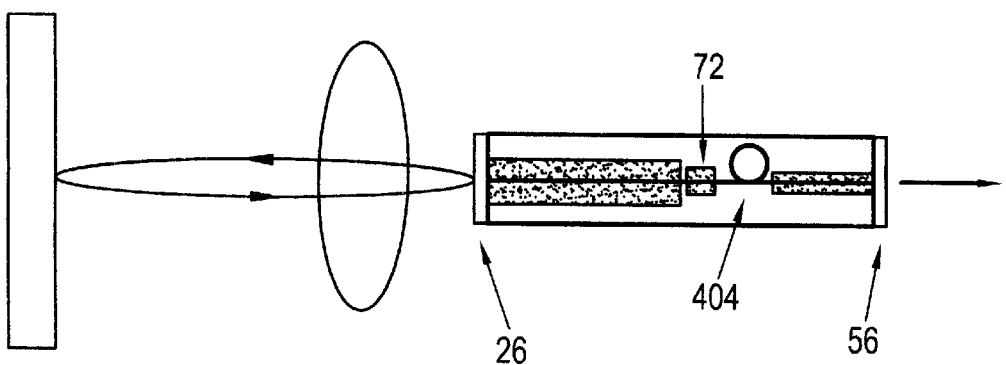
FIG. 6 is a diagrammatic depiction of a mode-locked external cavity laser with an integrated modulator and a waveguide loop mirror, in accordance with the present invention.

In an additional embodiment, as embodied herein and as shown in FIGS. 5 and 6, the optical transmitter further includes a saturable absorber 72 grown on the same active layer as the gain element 16 and disposed between the gain element 16 and the partial reflector in the form of an etched facet 402 in FIG. 5 and a loop mirror in FIG. 6 or any other forms of a suitable partial reflector. The wavelengh-locked lasers of FIGS. 5 and 6 are now modified to form mode-locked lasers. The same fabrication process, as above, can also be applied to build such a mode-locked laser with an integrated modulator for time-division multiplexing (TDM) system applications. The extra reverse biased saturable absorber 72, made of or grown on the same active layer as the gain element 16, is integrated on the chip to initiate the mode-locking at a rate determined by the round trip time of the light in the external cavity 32. The repetitive narrow pulse is then modulated by the integrated modulator 14 to transmit the signal. The outputs from several such mode-lock lasers can be interleaved in the time domain to increase the total information throughput. A significant cost saving thus comes from eliminating the optical pigtailing normally required of a discrete modulator.

It will be apparent to those of ordinary skill in the pertinent art that modifications and variations can be made to the external cavity 32 of the present invention depending on the type of external cavity lasers that is desired. For example, the external cavity of FIGS. 1–6, instead of being an air cavity can be implemented as a fiber cavity of FIG. 13.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An optical transmitter module comprising:
   a substrate having a first anti-reflection end and a second anti-reflection end;
   an external reflector coupled to the first anti-reflection end of the substrate for providing an external cavity for providing a round-trip path for light travel and the external reflector providing a first cavity end for a modified extended laser cavity which is extended from the external cavity;
   at least one gain element included within the modified extended laser cavity and the at least one gain element processed integral with the substrate and near the first anti-reflection end;

an optical modulator for providing external modulation external to the modified extended laser cavity and the optical modulator processed integral with the substrate and near the second anti-reflection end; and a partial reflector processed integral with the substrate and coupling the at least one gain element with the optical modulator, the partial reflector providing a second cavity end for the modified extended laser cavity.

2. The optical transmitter module of claim 1 wherein the partial reflector comprises:

an etched facet.

3. The optical transmitter module of claim 1 wherein the partial reflector comprises a loop mirror.

4. The optical transmitter module of claim 1 wherein the partial reflector comprises a distributed Bragg reflector (DBR) mirror.

5. The optical transmitter module of claim 1 further comprising:

a saturable absorber integral with the substrate and coupling the at least one gain element with the partial reflector.

6. The optical transmitter module of claim 1 wherein the substrate comprises a waveguide having a first anti-reflection (AR) coated facet as the first anti-reflection end and a second opposed AR coated facet as the first anti-reflection end on opposed ends of the waveguide.

7. The optical transmitter module of claim 1 wherein the at least one gain element is grown on the active layer of the substrate to have a first bandgap wavelength.

8. The optical transmitter module of claim 6 wherein the optical modulator comprises an electroabsorption modulator element between the partial reflector and the second AR coated facet.

9. The optical transmitter module of claim 7 wherein the optical modulator is grown on the substrate to have a second bandgap wavelength shorter than the first bandgap wavelength of the at least one gain element.

10. An optical transmitter comprising:

an external cavity for providing a round-trip path for light travel;

a substrate connected to the external cavity, the substrate having a first anti-reflection end and a second anti-reflection end;

an external reflector coupled to the first anti-reflection end of the substrate for providing the external cavity and the external reflector serving as a first cavity end for a modified extended laser cavity which is extended from the external cavity;

at least one gain element included within the modified extended laser cavity and the at least one gain element integral with the substrate and near the first anti-reflection end;

an optical modulator for providing external modulation external to the modified extended laser cavity and the optical modulator integral with the substrate and near the second anti-reflection end; and a partial reflector integral with the substrate and coupling the at least one gain element with the optical modulator, the partial reflector providing a second cavity end for the modified extended laser cavity.

11. The optical transmitter of claim 10 wherein the external cavity comprises a collimating lens and a filter optically coupled to the collimating lens for reflecting the light to provide the round-trip path.

12. An optical transmitter comprising:

an external cavity for providing a round-trip path for light travel;

a substrate connected to the external cavity, the substrate comprising a waveguide having a first and second opposed AR coated facets;

an external reflector coupled to the first opposed AR coated facet of the waveguide for providing the external cavity and the external reflector serving as a first cavity end for a modified extended laser cavity which is extended from the external cavity;

at least one gain element included within the modified extended laser cavity and the at least one gain element integral with the substrate and near the first opposed AR coated facet;

an optical modulator for providing external modulation external to the modified extended laser cavity and the optical modulator integral with the substrate and near the second opposed AR coated facet;

a partial reflector integral with the substrate and coupling the at least one gain element with the optical modulator, the partial reflector providing a second cavity end for the modified extended laser cavity.

13. The optical transmitter of claim 12 wherein the external cavity comprises an air cavity having one end defined by a collimating lens and a filter optically coupled to the collimating lens for reflecting the light to provide the round-trip path in the air cavity.

14. The optical transmitter of claim 12 wherein the external cavity comprises a fiber cavity having a fiber grating for reflecting the light to provide the round-trip path in the fiber cavity.

15. The optical transmitter of claim 12 wherein the optical transmitter comprises a wavelength division multiplexing (WDM) transmitter.

16. The optical transmitter of claim 12 wherein the optical transmitter comprises a high-speed dense wavelength-division multiplexing (DWDM) transmitter for modulation above 2.5 Gbits/sec.

17. The optical transmitter of claim 12 wherein the optical transmitter comprises a time-division multiplexing (TDM) transmitter.

18. The optical transmitter of claim 12 wherein the partial reflector is broadband with respect to the narrower bandwidth of the external reflector such that the external reflector determines the lasing wavelength.

19. The optical transmitter of claim 12 wherein the partial reflector comprises a distributed Bragg reflector (DBR) having a grating fabricated on the same passive layer as the optical modulator.

20. The optical transmitter of claim 12 further comprising a saturable absorber grown on the same active layer as the at least one gain element and disposed between the at least one gain element and the partial reflector.

* * * * *